United States Patent [19]

Moore et al.

[11] Patent Number: 6,165,610
[45] Date of Patent: Dec. 26, 2000

[54] METALLIZED FILM COMPRISING BLEND OF POLYESTER AND ETHYLENE COPOLYMERS

[75] Inventors: Neal E. Moore, Newark, Del.; Danilo O. De La Cruz, Cincinnati, Ohio

[73] Assignee: Printpack Illinois, Inc., Elgin, Ill.

[21] Appl. No.: 08/298,088

[22] Filed: Aug. 29, 1994

Related U.S. Application Data

[63] Continuation of application No. 08/004,740, Jan. 14, 1993, abandoned.

[51] Int. Cl.$^7$ .............................. B32B 7/04; B32B 15/04; B32B 15/08; B32B 27/36
[52] U.S. Cl. ..................... 428/344; 428/35.8; 428/349; 428/355 AC; 428/457; 428/458; 428/463; 525/165; 525/166; 525/174; 525/176
[58] Field of Search ................... 428/480, 457, 428/458, 463, 35.3, 35.7, 35.8, 343, 344, 346, 347, 349, 462, 355 AC; 525/92, 176, 165, 166, 170, 174

[56] References Cited

U.S. PATENT DOCUMENTS

| | | | |
|---|---|---|---|
| 3,435,093 | 3/1969 | Cope | 260/857 |
| 3,639,527 | 2/1972 | Brinkman et al. | 260/873 |
| 4,010,222 | 3/1977 | Shih | 260/873 |
| 4,046,837 | 9/1977 | Carroll | 260/873 |
| 4,172,859 | 10/1979 | Epstein | 428/402 |
| 4,528,234 | 7/1985 | Kaiho et al. | 428/216 |
| 4,859,741 | 8/1989 | Takahashi et al. | 525/123 |
| 4,891,406 | 1/1990 | Bittscheidt et al. | 525/64 |
| 5,039,744 | 8/1991 | Golder | 525/92 |
| 5,059,470 | 10/1991 | Fukuda et al. | 428/142 |
| 5,112,462 | 5/1992 | Swisher | 205/165 |
| 5,173,357 | 12/1992 | Nakane et al. | 428/220 |
| 5,209,972 | 5/1993 | Super et al. | 428/349 |
| 5,256,359 | 10/1993 | Hahm | 264/211.12 |

*Primary Examiner*—Vivian Chen
*Attorney, Agent, or Firm*—Sutherland Asbill & Brennan, LLP

[57] ABSTRACT

Compared to a polyester film, films made from a blend of the polyester and up to 20 percent of an ethylene-acrylate copolymer have improved tear strength and heat seal strength while maintaining acceptable gloss, clarity, and coefficient of friction. The heat seal strength of the film and the bond strength of the film to aluminum vacuum deposited on the film are improved by adding less than five percent of an ethylene-acid copolymer to the blend.

5 Claims, No Drawings

METALLIZED FILM COMPRISING BLEND OF POLYESTER AND ETHYLENE COPOLYMERS

This is a continuation of application Ser. No. 08/004,740, filed Jan. 14, 1993, now abandoned.

This invention is an extruded film made from a blend of a polyester and an ethylene copolymer.

Articles made from a blend of a polyester and certain ethylene copolymers are known in the art. U.S. Pat. No. 3,435,093 to Cope and U.S. Pat. No. 3,639,527 to Brinkmann et al disclose the addition of ionomers to polyesters for the purpose of improving the toughness and dimensional stability of the composition for use as a molding resin. U.S. Pat. No. 4,046,837 to Carroll discloses the addition of polyethylene to a polyester to improve the flow rate of the composition for extrusion coating. U.S. Pat. No. 4,172,859 to Epstein discloses the addition to polyesters of certain random copolymers that may contain ethylene as a comonomer, but if they do, the copolymer must also contain at least two other comonomers. The random copolymers are added to toughen the composition. While the addition of ionomers and other copolymers of ethylene with acid comonomers improves certain properties of films made from the compositions, the copolymers reduce the clarity and gloss of films made from the compositions. Clarity and gloss are important properties of films used for packaging snack food and other consumer goods.

This invention provides improved polyester films that are especially suitable for packaging snack foods and other consumer goods. In addition to having good clarity and gloss, the films of the invention have good tear strength, good coefficient of friction for machinability, and are capable of forming good heat seals. In preferred embodiments, the films form a good bond to metals, such as aluminum, that are vacuum deposited on the film.

The films of this invention are made by forming a blend of a polyester and a copolymer of ethylene and a comonomer selected from the group consisting of methyl acrylate, ethyl acrylate, n-butyl acrylate, methyl methacrylate, and ethyl methacrylate. For convenience, the copolymer will be referred to herein as an ethylene-acrylate copolymer. The copolymer is preferably a block copolymer of ethylene and methyl acrylate. The proportion of acrylate comonomer in the copolymer preferably ranges from about 2 to 25 percent by weight. The ethylene-acrylate copolymer does not contain an acid comonomer.

The polyester is prepared from an aromatic dicarboxylic acid having from 8 to 14 carbon atoms and a glycol selected from the group consisting of a glycol of the formula HO$(CH_2)_N$OH wherein n is an integer from 2 to 10, neopentyl glycol and cyclohexane dimethanol, a portion of the moles of acid being replaceable by at least one acid taken from the group consisting of at least one different aromatic dicarboxylic acid having from 8 to 14 carbon atoms in an amount up to 50 mole percent, and an aliphatic dicarboxylic acid having from 2 to 12 carbon atoms in an amount up to 20 mole percent. The polyester preferably has an intrinsic viscosity of from about 0.6 to 1.2 deciliters per gram. Preferred polyesters include polyethylene terephthalate and ethylene terephthalate-isophthalate copolymer.

The amount of polyester in the blend preferably ranges from about 80 percent to about 92 percent by weight. The amount of ethylene-acrylate copolymer in the blend preferably ranges from about 8 to 20 percent by weight. In preferred embodiments, the blend also contains from about 1 to 5 percent by weight of a copolymer of ethylene and a comonomer selected from the group consisting of acrylic acid and methacrylic acid. For convenience, such copolymers will be referred to herein as acid copolymers. The acid copolymer may be an ionomer wherein up to 70 percent of the carboxylic acid groups are neutralized to form sodium or zinc salts. The acid copolymers improve the heat seal strength of the films of this invention and adhesion of the films to metals vacuum deposited on the films.

The clarity of a film is expressed in terms of its percent haze, with clearer films having a lower percent haze. The films of this invention have a percent haze, as measured in accordance with ASTM D1003, of less than about 28 percent. The films have a gloss, as measured in accordance with ASTM D2457, of at least 50 percent, preferably at least 70 percent. The films have a coefficient of friction (blend surface to blend surface), as measured in accordance with ASTM D1849, of between about 0.1 and 0.8. The films have a heat seal strength of at least 500 grams per inch, preferably at least 1000 grams per inch. As used herein and in the claims, the term "heat seal strength" refers to the strength of the seal that results when a blend surface of the film is heat sealed to itself at an elevated temperature (240 to 270 degrees F.) for one-half second at a pressure of 30 psi. The films of this invention have an Elmendorf tear strength of at least 25 grams, preferably at least 80 grams, in both the machine direction and cross-machine direction. In preferred embodiments, the film has a bond strength to aluminum vacuum deposited on the film of at least 300 grams per inch, preferably at least 600 grams per inch. The bond strength is measured by heat sealing the film to a film made from an acid-modified ethylene copolymer, and then pulling the films apart.

The films of this invention are preferably not oriented but may be oriented if desired. The films of this invention are preferably monolayer films, but they may be coextruded multilayer films wherein the blend of this invention forms one or both of the surface layers.

Films of this invention having a layer of aluminum vacuum deposited on them are preferably laminated to a protective layer overlying the aluminum layer. The protective layer is preferably a film of oriented polypropylene, which may be printed on the surface contacting the layer of aluminum. The protective layer is preferably laminated to the metallized film by extruding an adhesive polymer between the metallized film and the protective film and then pressing the film together. The adhesive polymer is preferably an acid-modified ethylene copolymer conventionally used for such applications, such as those sold under the trademarks Plexar and Bynel. When the films of this invention are metallized, the gloss and clarity of the films are still evident when the film is viewed from the surface opposite the metallized surface. For example, the metal has a shinier, more mirror-like appearance when viewed through the film of the invention compared to a film made from a binary blend of polyester and an acid copolymer.

EXAMPLE 1

A monolayer film was prepared by cast extrusion of a blend of 85 percent polyethylene terephthalate (Eastman 9921) and 15 percent of a random copolymer of ethylene and 20 percent methyl acrylate (Chevron 2205). The thickness of the film was 0.6 mil. Physical properties of the film as well as the films of Examples 2–7 are reported in Table 1. The heat seals referred to in Table I were formed at 250 degrees F. at 30 psi for one-half second.

EXAMPLE 2

Example 1 was repeated except the blend consisted of 80 percent of the polyester and 20 percent of the acrylate copolymer. In the Table, NT means "no tear".

EXAMPLE 3

Example 1 was repeated except the acrylate copolymer was derived from 24 percent methyl acrylate (Chevron 2260).

EXAMPLE 4 and 5

Examples 1 and 2 were repeated except the acrylate copolymer was a block copolymer (Chevron DS1199).

EXAMPLE 6

Example 2 was repeated except the acrylate comonomer was n-butyl acrylate (Quantum EA720).

TABLE I

| Property | Example 1 | 2 | 3 | 4 | 5 | 6 |
|---|---|---|---|---|---|---|
| Elmendorf Tear, gms | | | | | | |
| MD | 33 | 27 | 81 | 58 | 34 | 45 |
| CMD | 27 | NT | 38 | 26 | NT | 30 |
| Gloss, Percent | 70 | 61 | 82 | 82 | 68 | 70 |
| Haze, Percent | 21 | 25 | 20 | 20 | 24 | 22 |
| Heat Seal Strength, gms/inch | 589 | 529 | 763 | 872 | 821 | 535 |

EXAMPLE 7

Monolayer films were prepared by cast extrusion of a blend of 87.5 percent polyethylene terephthalate, 10 percent of a copolymer of ethylene and 20 percent methyl acrylate (Chevron DS1199), and 2.5 percent of a copolymer of ethylene and 9 percent methacrylic acid (Nucrel 0903). The properties of the films are reported in Table 2. The heat seal referred to in the Table was formed at 270 degrees F. at a pressure of 30 psi for one-half second. In the Table, "T" means corona treated and "UT" means untreated.

TABLE 2

| Property | Average | Standard Deviation | Samples |
|---|---|---|---|
| Thickness, mils | 0.62 | 0.02 | 49 |
| Elmendorf, Tear, gms | | | |
| MD | 202 | 54 | 14 |
| CMD | 88 | 24 | 14 |
| Gloss, percent | 54.6 | 3.7 | 49 |
| Haze, percent | 24.7 | 1.8 | 49 |
| Heat Seal Strength gms/inch | 1226 | 136 | 15 |
| Coefficient of Friction | | | |
| UT/UT | 0.32 | 0.07 | 37 |
| T/T | 0.53 | 0.12 | 37 |

This Example illustrates that the addition of a small amount of an acid copolymer to the composition has a somewhat adverse effect on gloss, but greatly improves the tear strength and heat seal strength of the films. The improved adhesion makes the films especially suitable for metallizing, as illustrated by the following example.

EXAMPLE 8

A monolayer film was prepared by cast extrusion of a blend of 87.5 percent polyester terephthalate, 10 percent of a copolymer of ethylene and 20 percent methyl acrylate (DS1199), and 2.5 percent of a copolymer of ethylene and 9 percent methacrylic acid (Nucrel 0903). The film was vacuum metallized with aluminum and then laminated to oriented polypropylene film by extruding an acid-modified ethylene copolymer (Bynel 2002) between the films. The bond strength of the film to the aluminum deposited thereon was 800 grams per inch with only slight pick off of the aluminum.

What is claimed is:

1. A cast extruded plastic film having a layer comprising a blend of about 80 to 92 percent of a polyester, 8 to 20 percent of a copolymer consisting of ethylene and a comonomer selected from the group consisting of methyl acrylate, ethyl acrylate, methyl methacrylate and ethyl methacrylate, and about 1 to 5 percent of a copolymer of ethylene and a comonomer selected from the group consisting of acrylic acid and methacrylic acid, the layer having less than 28 percent haze, more than 50 percent gloss, a coefficient of friction between about 0.1 and 0.8, a heat seal strength, when heat sealed to itself at a temperature between about 240 and 270 degrees F., of at least 500 grams per inch, and a layer of metal vacuum deposited thereon, the bond strength between the layer comprising the blend and the metal layer being at least 300 grams per inch.

2. The film of claim 1 having an Elmendorf tear strength of at least 25 grams.

3. The film of claim 1 wherein the bond strength between the layer comprising the blend and the metal layer is at least 600 grams per inch.

4. The film of claim 1 wherein the metal is aluminum.

5. The film of claim 1 wherein the polyester is polyethylene terephthalate or ethylene terephthalate-isophthalate copolymer.

* * * * *